(12) United States Patent  
Gandhi et al.

(10) Patent No.: US 8,729,590 B2  
(45) Date of Patent: May 20, 2014

(54) SOLID STATE LIGHTING DEVICES HAVING SIDE REFLECTIVITY AND ASSOCIATED METHODS OF MANUFACTURE

(71) Applicant: Micron Technology, Inc., Boise, ID (US)

(72) Inventors: Jaspreet S. Gandhi, Boise, ID (US); Tongbi Jiang, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 13/870,740

(22) Filed: Apr. 25, 2013

(65) Prior Publication Data

US 2013/0240939 A1 Sep. 19, 2013

Related U.S. Application Data

(63) Continuation of application No. 13/152,572, filed on Jun. 3, 2011, now Pat. No. 8,436,386.

(51) Int. Cl.  
H01L 33/00 (2010.01)

(52) U.S. Cl.  
USPC .......................................................... 257/98

(58) Field of Classification Search  
USPC ............. 257/20, 79–103, 116, 17, 432–437, 257/749, E33.056–E33.059, E25.032, 13, 257/117, E51.018–E51.022, 257/E33.001–E33.077, E33.054, E25.028; 438/25–28, 51, 55, 64–68, 83, 98  
See application file for complete search history.

(56) References Cited

U.S. PATENT DOCUMENTS

| | | | |
|---|---|---|---|
| 6,952,025 B2 * | 10/2005 | Kamemura et al. | 257/98 |
| 7,148,514 B2 | 12/2006 | Seo et al. | |
| 7,785,715 B2 | 8/2010 | Tsumura et al. | |
| 2003/0057421 A1 | 3/2003 | Chen | |
| 2004/0087050 A1 | 5/2004 | Uemura et al. | |
| 2005/0063187 A1 | 3/2005 | Weng et al. | |
| 2007/0290215 A1 | 12/2007 | Kato et al. | |

(Continued)

FOREIGN PATENT DOCUMENTS

WO 2009075530 A2 6/2009

OTHER PUBLICATIONS

Atwater Jr., H.A., Ion Beam Enhanced Grain Growth in Thin Films, RLE Technical Report No. 527, Massachusetts Institute of Technology, Research Laboratory of Electronics, pp. 1-224, Mar. 1987.

(Continued)

*Primary Examiner* — Dao H Nguyen  
*Assistant Examiner* — Tram H Nguyen  
(74) *Attorney, Agent, or Firm* — Perkins Coie LLP

(57) ABSTRACT

Solid state lighting devices having side reflectivity and associated methods of manufacturing are disclosed herein. In one embodiment, a method of forming a solid state lighting device includes attaching a solid state emitter to a support substrate, mounting the solid state emitter and support substrate to a temporary carrier, and cutting kerfs through the solid state emitter and the substrate to separate individual dies. The solid state emitter can have a first semiconductor material, a second semiconductor material, and an active region between the first and second semiconductor materials. The individual dies can have sidewalls that expose the first semiconductor material, active region and second semiconductor material. The method can further include applying a reflective material into the kerfs and along the sidewalls of the individual dies.

16 Claims, 7 Drawing Sheets

(56) References Cited

U.S. PATENT DOCUMENTS

| | | | |
|---|---|---|---|
| 2008/0293172 | A1 | 11/2008 | Lee et al. |
| 2009/0267096 | A1 | 10/2009 | Kim |
| 2009/0278161 | A1 | 11/2009 | Lee et al. |
| 2010/0029023 | A1 | 2/2010 | Neff et al. |
| 2011/0018013 | A1 | 1/2011 | Margalith et al. |
| 2011/0278628 | A1 | 11/2011 | Lee |
| 2011/0297978 | A1* | 12/2011 | Takeuchi et al. ............ 257/89 |
| 2011/0316024 | A1* | 12/2011 | Hung et al. ................ 257/98 |
| 2012/0098001 | A1* | 4/2012 | Cheng ........................ 257/98 |
| 2012/0146081 | A1 | 6/2012 | Lee |
| 2012/0218624 | A1* | 8/2012 | Narendran et al. .......... 359/326 |
| 2012/0305957 | A1 | 12/2012 | Gandhi et al. |

OTHER PUBLICATIONS

Awater H.A. et al. Mechanisms for Cystallographic Orienatation in the Crystallization of Thin Silicon Films fom the Melt, J. Mater. Res., vol, 3, No. 6, pp. 1232-1237, Nov./Dec. 1988.

Atwater, H.A. et al., Zone-Melting Recrystallization of Thick Silicon on Insulator Films, Materials Letters, vol. 2, No. 4A, pp. 269-273, Mar. 1984.

Choi, J,-H. et al. Zone Melting Recrystallization of Polysilicon by a Focused-Lamp with Unsymmetric Trapezoidal Power Distribution, Journal of Electronic Materials, vol. 20, No. 3. pp. 231-235, Mar. 1991.

Colinge, J.-P., Silicon-on-Insulator Technology: Materials to VLSI, 2nd Edition, pp, 16-27 and 52-65, Sep. 1997.

Geis, M.W. et al., (Invited) Silicon Graphoepitaxy, Proceedings of the 12th Conference on Solid State Devices, Tokyo 1980, Japanese Journal of Applied Physics, vol. 20, Supplement 20-1, pp. 39-42, 1981.

Geis, M.W. et al., Grapho-Epitaxy of Silicon on Fused Silica using Surface Micropatterns and Laser Crystallization, J. Vac. Sci. Technol., vol. 16, No. 6, pp. 1640-1643. Nov./Dec. 1979.

Geis, M.W. et al., Summary Abstract: Silicon Graphoepitaxy, J. Vac. Sci. Technol,, vol. 18, No. 2, pp. 229-230, Mar. 1981.

Geis, M.W. et al., Zone-Melting Recrystallization of Si Films with a Moveable-Strip-Heater Oven, J. Electrochem. Soc.: Solid State Science and Technology, vol. 129, No. 12, pp. 2812-2818. Dec. 1982.

Givargizov, E.I., Graphoepitaxy as an Approach to Oriented Crystallization on Amorphous Substrates, Journal of Crystal Growth, vol. 310, No. 7-9, pp. 1686-1690, Apr. 2008.

International Search Report and Written Opinion mailed Nov. 30, 2012 in International Application No. PCT/US2012/040018, 7 pages.

Klykov, V.I. et al. Artificial Epitaxy (Diataxy) of Silicon and Germanium, Acta Physica Academiae Scientiarurn Hungaricae, vol. 47, Nos. 1-3, pp. 167-183, Mar. 1979.

Minagawa, Y. et al. Fabrication of (111)-Oriented Si Film with a Ni/Ti Layer by Metal Induced Crystallization, Jpn. J. Appl. Phys., vol. 20, Part 2, No. 3A, pp. L186-L188, Mar. 2001.

Moon B.Y. et al. Study on the Polycrystalline Silicon Films Deposted by Inductively Coupled Plasma Chemical Vapor Deposition, Mat. Res. Soc. Symp. Proc., vol. 685E, pp, D5.2.1-D5.2.6, 2001.

Naomoto, H. et al., Characterization of Thin-Film Silicon Formed by High-Speed Zone-Melting Recrystallization Process, Solar Energy Materials and Solar Cells, vol. 48, Nos. 1-4, pp. 261-267, Nov. 1997.

Pauli, M. et al., Large Area and Rapid Thermal Zone Melting Crystallization of Silicon Films on Graphite Substrates for Photovoltaic Use, Conference Record of the 23rd IEEE Photovoltaic Specialists Conference, pp. 195-200, May 1993.

Scharff, W. et al., Flash-Lamp-Induced Crystal Growth of Silicon on Amorphous Substrates Using Artificial Surface-Relief Structures, Physica Status Solidi (a), vol. 74, No. 2, pp, 545-552, Dec. 1982.

Wan, J. et al., Growth of Crack-Free Hexagonal GaN Films on Si(100), Applied Physics Letters, vol. 79, No. 10, pp. 1459-1461, Sep. 2001.

Yoon, S.M. et al., Numerical Simulation of Scanning Speed and Supercooling Effects During Zone-Melting-Recrystallization of SOI Wafers, Mat. Res. Soc. Symp. Proc., vol. 205, pp. 453-458, 1990.

\* cited by examiner

SOLID STATE LIGHTING DEVICES HAVING SIDE REFLECTIVITY AND ASSOCIATED METHODS OF MANUFACTURE

CROSS-REFERENCE TO RELATED APPLICATION

This application is a continuation of U.S. application Ser. No. 13/152,572 filed Jun. 3, 2011, now U.S. Pat. No. 8,436,386, which is incorporated herein by reference in its entirety.

TECHNICAL FIELD

The present technology is directed generally to solid state lighting ("SSL") devices and associated methods of manufacturing solid state lighting devices.

BACKGROUND

SSL devices generally use light emitting diodes ("LEDs"), organic light emitting diodes ("OLEDs"), and/or polymer light emitting diodes ("PLEDs") as sources of illumination rather than electrical filaments, plasma, or gas. FIG. 1 is a schematic cross-sectional diagram of a conventional indium-gallium nitride (InGaN) LED 10 including a substrate material 12 (e.g., silicon), N-type gallium nitride (GaN) 14, GaN/InGaN multiple quantum wells ("MQWs") 16, and P-type GaN 18. The LED 10 also includes a first contact 20 on the P-type GaN 18 and a second contact 22 on the N-type GaN 14. During manufacturing, the N-type GaN 14, the GaN/InGaN MQWs 16, and the P-type GaN 18 are formed on the substrate material 12 via metal organic chemical vapor deposition ("MOCVD"), molecular beam epitaxy ("MBE"), liquid phase epitaxy ("LPE"), hydride vapor phase epitaxy ("HVPE"), and/or other epitaxial growth techniques, each of which is typically performed at elevated temperatures.

One aspect of the LED 10 shown in FIG. 1 is that scattering and absorption of radiation by the substrate 12 can decrease lumen output. Furthermore, radiation absorbed by the substrate 12 transforms into heat, which can further decrease lumen output and reduce the lifespan of the LED 10. Accordingly, several improvements in reliably and cost-effectively manufacturing LEDs while improving light extraction efficiency may be desirable.

DETAILED DESCRIPTION

Specific details of several embodiments of SSL devices and associated methods of manufacturing SSL devices are described below. The term "SSL" generally refers to "solid state light" and/or "solid state lighting" according to the context in which it is used. The term solid state emitter ("SSE") generally refers to the solid state components or light emitting structures that convert electrical energy into electromagnetic radiation in the visible, ultraviolet, infrared, and/or other spectra. SSEs include semiconductor LEDs, PLEDs, OLEDs, or other types of solid state devices that convert electrical energy into electromagnetic radiation in a desired spectrum. A person skilled in the relevant art will understand that the new technology may have additional embodiments and that the new technology may be practiced without several of the details of the embodiments described below with reference to FIGS. 2-3H.

Figure 2:
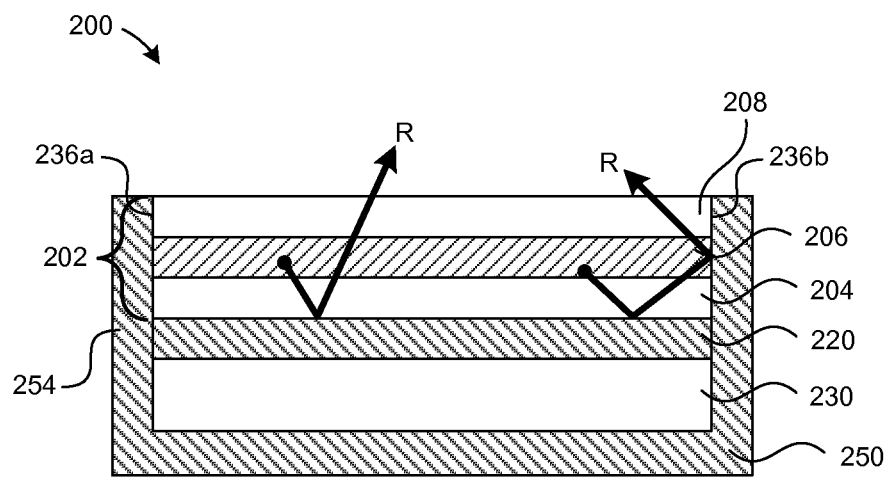
FIG. 2 is a cross-sectional view of an SSL device in accordance with embodiments of the technology.

FIG. 2 is a cross-sectional view of an SSL device 200 in accordance with embodiments of the technology. The SSL device 200 can include an SSE 202 mounted to a support substrate 230. The SSE 202 has sidewalls 236a, 236b. The SSL device 200 can further include (a) a first reflective material 220 between the support substrate 230 and the SSE 202, and (b) one or more reflective sidewalls 254 along at least a portion of one or more sidewalls 236a, 236b. In some embodiments, the SSL 200 includes a second reflective material 250 on backside of the support substrate 230 opposite the first reflective material 220

The SSE 202 can include a first semiconductor material 204, a second semiconductor material 208, and an active region 206 between the first and second semiconductor materials 204, 208. In one embodiment, the first semiconductor material 204 is a P-type gallium nitride ("GaN") material, the active region 206 is an indium gallium nitride ("InGaN") material, and the second semiconductor material 208 is a N-type GaN material. In other embodiments, the semiconductor materials of the SSE structure 202 can include at least one of gallium arsenide ("GaAs"), aluminum gallium arsenide ("AlGaAs"), gallium arsenide phosphide ("GaAsP"), aluminum gallium indium phosphide (AlGaInP), gallium(III) phosphide ("GaP"), zinc selenide ("ZnSe"), boron nitride ("BN"), aluminum nitride ("AlN"), aluminum gallium nitride ("AlGaN"), aluminum gallium indium nitride ("AlGaInN"), and/or other suitable semiconductor material.

Figure 1:
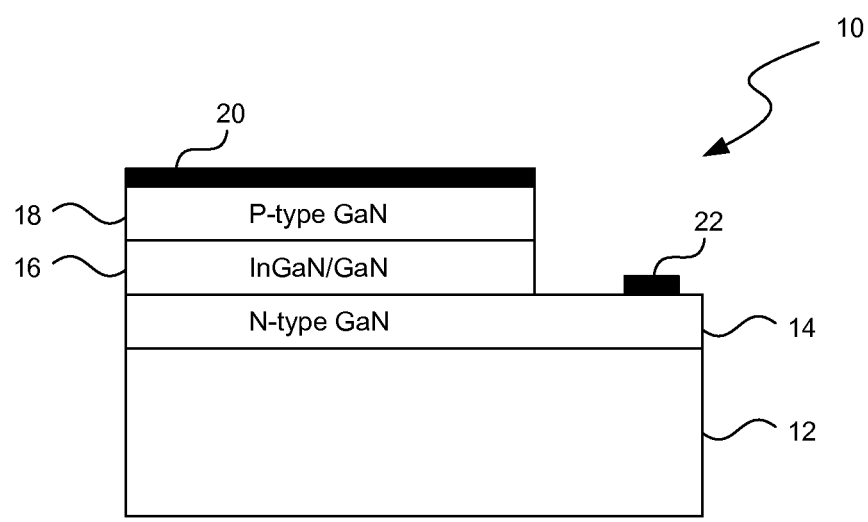
FIG. 1 is a cross-sectional view of a portion of a light emitting diode in accordance with the prior art.

In operation, as current flows from the first semiconductor material 204 to the second semiconductor material 208, charge-carriers flow from the second semiconductor material 208 toward the first semiconductor material 204 and cause the active region 206 to emit radiation. The radiation is in turn reflected off the first reflective material 220 and the reflective sidewalls 254 (see, e.g., radiation arrows R in FIG. 2). The first reflective material 220 and the reflective sidewalls 254 can accordingly reduce scattering and absorption of the radiation within the substrate by encasing the SSE in reflective materials. The reflective sidewalls 254 can reflect light from surrounding sources, thereby preventing the surrounding light from being absorbed by the substrate as heat. For example, in several embodiments, applying the reflective sidewall 254 is expected to increase the lumen output by about 5-7% for single die packages compared to the LED 10 shown in FIG. 1. The reflective sidewalls 254 can further increase the flux by about 8-10% for multi-die/array packages compared to SSL devices without reflective sidewalls.

The present technology further includes methods of manufacturing SSL devices. For example, one method of forming a SSL device can include attaching a SSE to a support substrate and mounting the SSE and support substrate to a temporary carrier. The SSE can include a first semiconductor material, a second semiconductor material, and an active region between the first and second semiconductor materials. The method further includes cutting kerfs through the SSE and the support substrate to separate individual dies. The individual dies can have sidewalls that expose the first semiconductor material, active region, and second semiconductor material. The method additionally includes applying a reflective material into the kerfs and along the sidewalls of the individual dies. These steps are described in further detail below with reference to FIGS. 3A-3H.

Figure 3A:
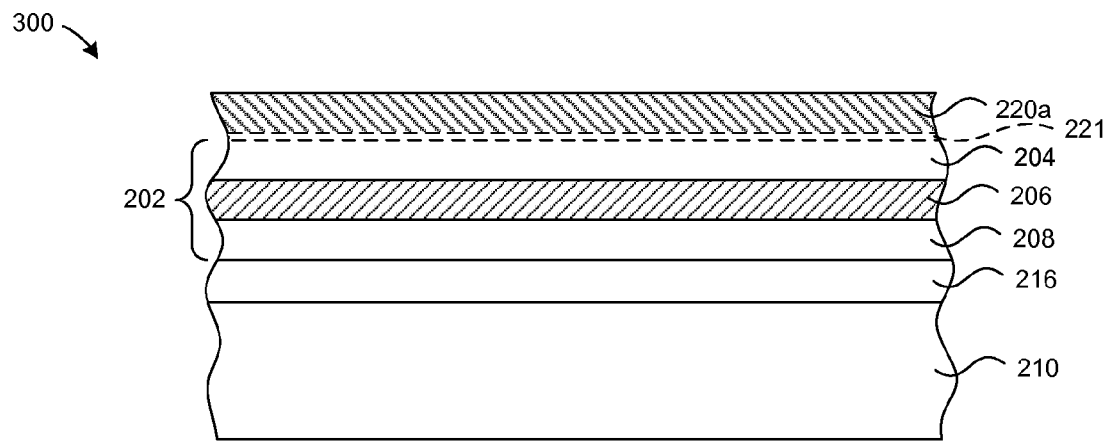
FIGS. 3A-3H are cross-sectional views of a portion of a microelectronic substrate undergoing a process of forming an SSL device in accordance with embodiments of the technology.

FIGS. 3A-3H are cross-sectional views of a portion of a microelectronic substrate 300 undergoing a process of forming an embodiment of the SSL device 100 in accordance with embodiments of the technology. FIG. 3A shows the substrate 300 after the SSE 202 has been formed on a semiconductor material 216 on a sacrificial substrate 210 (e.g., a growth substrate). The sacrificial substrate 210 can be silicon (e.g., Si (1,0,0) or Si (1,1,1)), sapphire, silicon carbide (SiC), polyaluminum nitride ("PAIN") or other suitable materials. The semiconductor material 216 can be the same material as the sacrificial substrate 210 or a separate material bonded to the sacrificial substrate 210. For example, the sacrificial substrate 210 can be PAIN and the semiconductor material 216 can be Si (1,1,1).

The first semiconductor material 204, active region 206, and second semiconductor material 208 can be deposited or otherwise formed using chemical vapor deposition ("CVD"), physical vapor deposition ("PVD"), atomic layer deposition ("ALD"), plating, or other techniques known in the semiconductor fabrication arts. In the embodiment shown in FIG. 3A, the second semiconductor material 208 is grown or formed on the semiconductor material 216, the active region 206 is grown or formed on the second semiconductor material 208, and the first semiconductor material 204 is grown or formed on the active region 206. In one embodiment, an N-type GaN (as described above with reference to FIG. 2) is proximate to the sacrificial substrate 210, but in other embodiments a P-type GaN is proximate to the sacrificial substrate 210. In other embodiments, the SSE 202 can include buffer materials, stress control materials, or other materials, and the materials can have other arrangements known in the art.

In the embodiment shown in FIG. 3A, a first reflective material 220a is formed over the first semiconductor material 204. The first reflective material 220a can be silver (Ag), gold (Au), gold-tin (AuSn), silver-tin (AgSn), copper (Cu), aluminum (Al), or any other suitable material that reflects light emitted from the active region 216 back through the first semiconductor material 204, the active region 206, and the second semiconductor material 208, as described above with reference to FIG. 2. The first reflective material 220a can be selected based on its thermal conductivity, electrical conductivity, and/or the color of light it reflects. For example, silver generally does not alter the color of the reflected light. Gold, copper, or other colored reflective materials can affect the color of the light and can accordingly be selected to produce a desired color for the light emitted by the SSE device 202. The first reflective material 220a can be deposited directly on the first semiconductor material 204, or a transparent electrically conductive material 221 (shown in broken lines) can be disposed between the first semiconductor material 204 and the first reflective material 220a. The transparent electrically-conductive material 221 can be indium tin oxide (ITO) or any other suitable material that is transparent, electrically conductive, and adheres or bonds the first reflective material 220a to the first semiconductor material 204. The transparent electrically conductive material 221 and the first reflective material 220a can be deposited using CVD, PVD, ALD, plating, or other techniques known in the semiconductor fabrication arts.

Figure 3B:
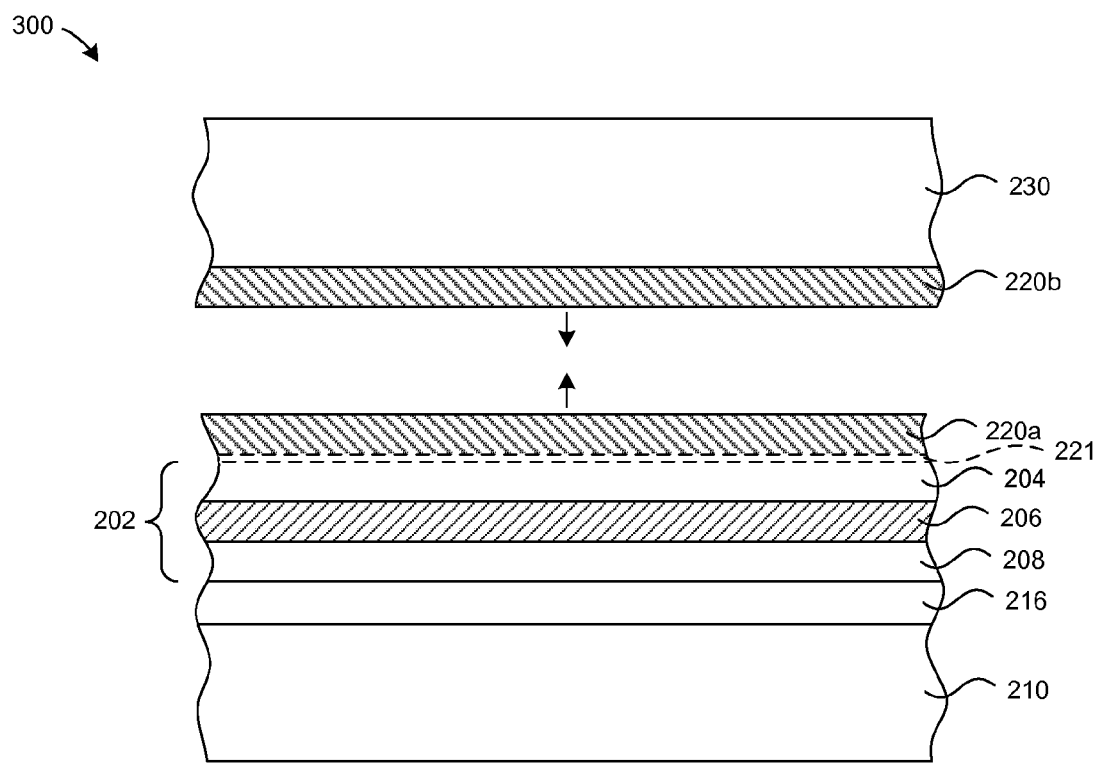
Figure 3C:
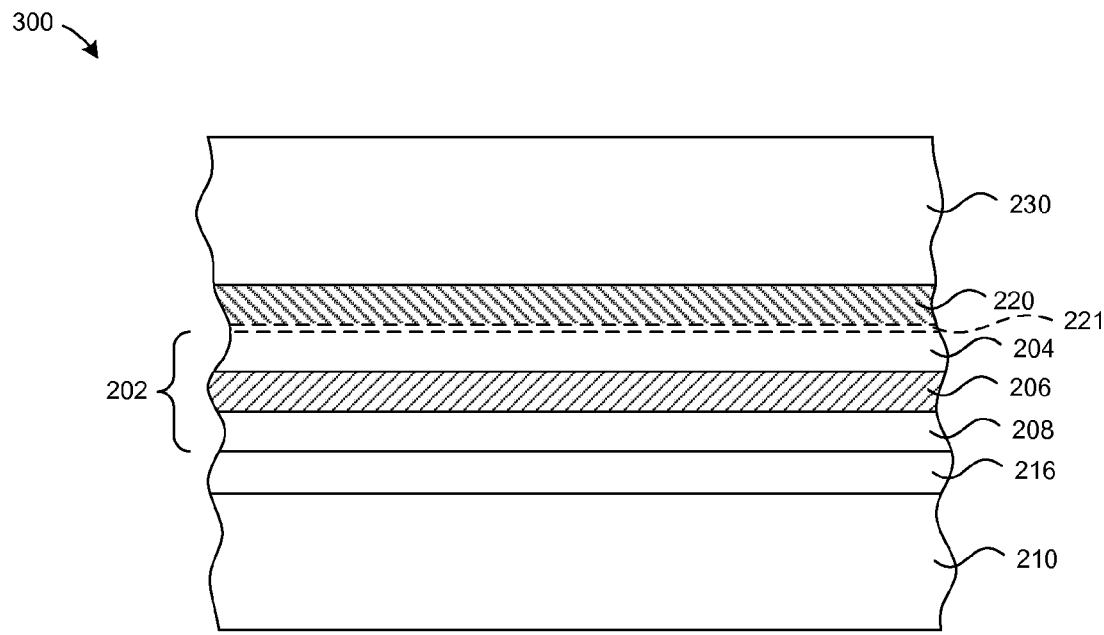

FIG. 3B illustrates an embodiment of a support substrate 230 being bonded or otherwise attached to the SSE 202. The support substrate 230 can include an optional backside reflective material 220b. The backside reflective material 220b is bonded, united or otherwise attached to the first reflective material 220a using a pressure and/or elevated temperature process. FIG. 3C shows an embodiment in which the bonded reflective materials 220a, 220b form a combined reflective material 220.

Figure 3D:
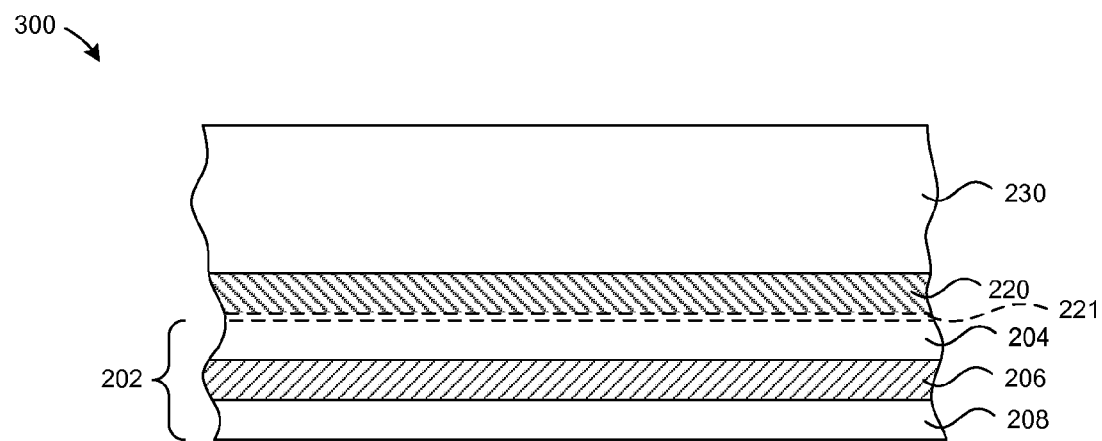

FIG. 3D illustrates the microelectronic substrate 300 after the semiconductor material 216 and the sacrificial substrate 210 have been removed using grinding, etching, and/or other processes to expose the second semiconductor material 208 or other portions of the SSE 202.

Figure 3E:
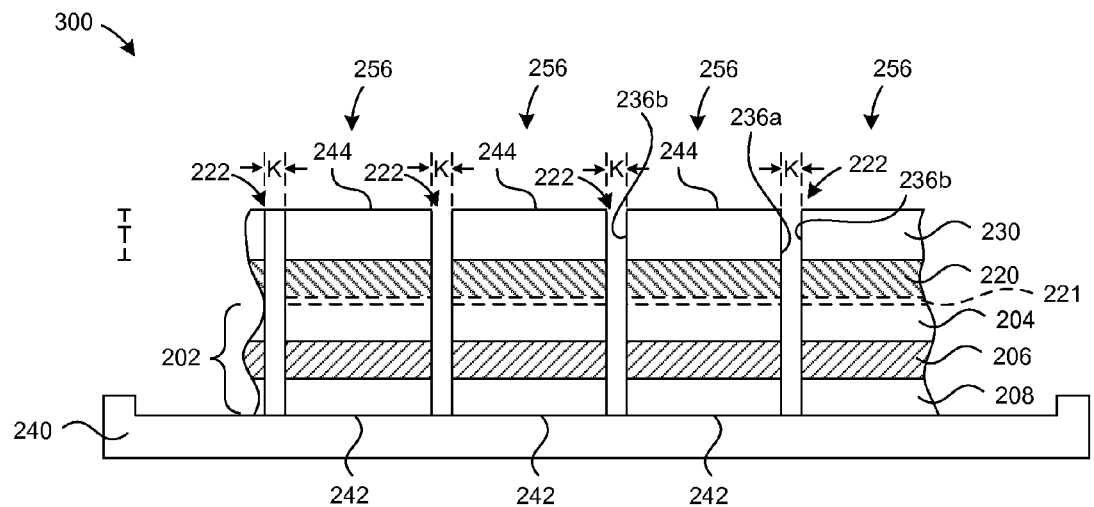

FIG. 3E shows the microelectronic substrate 300 after it has been mounted to a temporary carrier 240 and kerfs 222 have been formed. The temporary carrier substrate 240 can be any suitable material used in the handling and processing of semiconductor wafers, such as a carrier tape or a stainless steel device. In one embodiment, the SSE 202 is mounted to the carrier substrate 240, the support substrate 230 is reduced to a thickness T from about 100 microns to about 300 microns, and then the kerfs 222 are cut into the substrate 300. The kerfs 222 can be cut through all or a portion of the depth of the SSE 202 along dicing lanes to divide the support substrate 230 and SSE 202 into individual dies 256. Each individual die 256 has a first surface 242 contacting the carrier substrate 240, a second surface 244 opposite the first surface 242, a first sidewall 236a, and a second sidewall 236b opposite the first sidewall 236a. The kerfs 222 provide an opening K between the first sidewall 236a and the second sidewall 236b of adjacent dies 256 such that the sidewalls 236a, 236b are deep enough to expose the first semiconductor material 204, the active region 206, and the second semiconductor material 208. The substrate 300 can be cut into individual dies 256 by blade dicing or other cutting techniques. In one embodiment, for example, the substrate is cut with a blade having a thickness from about 25 microns to about 50 microns. In other embodiments, blades having other sizes can be used.

Figure 3F:
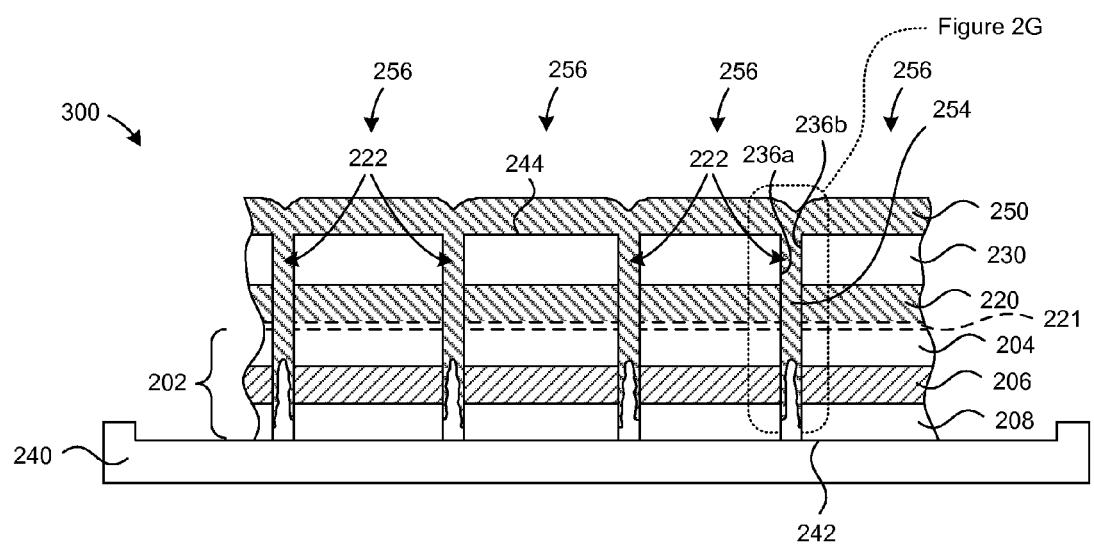
Figure 3G:
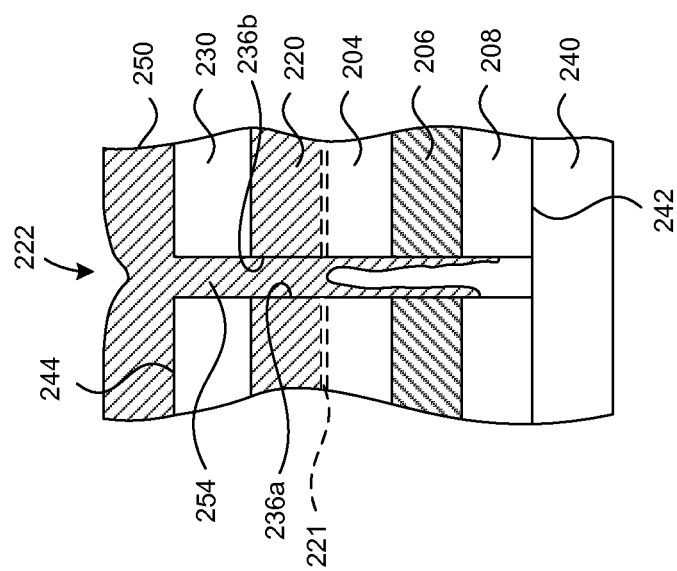

FIG. 3F is a cross-sectional view and FIG. 3G is a detailed view of a portion of FIG. 3F that illustrate an embodiment of the process after a second reflective material 250 has been applied onto the second surface 244 of the individual dies 256 and into at least a portion of the kerfs 222. In some embodiments, the second reflective material 250 can be applied in a layer having a thickness from about one micron to about five microns. The second reflective material 250 can flow into the kerfs 222 and form one or more reflective sidewalls 254 along at least a portion of at least one of the sidewalls 236a, 236b of the individual dies 256. The second reflective material 250 can be any of the materials described above with reference to the first reflective material 220. In one embodiment, the second reflective material 250 is Titanium-Nickel-Gold-Tin or Titanium-Nickel-Silver-Tin. In other embodiments, the second reflective material 250 can be silver (Ag), gold (Au), gold-tin (AuSn), silver-tin (AgSn), copper (Cu), aluminum (Al), or any other suitable material that reflects light emitted from the active region 216 toward the first surface 242 of the die 256.

The second reflective material 250 can be deposited using CVD, PVD, ALD, or other techniques known in the semiconductor fabrication arts. For example, in some embodiments, the second reflective material 250 can be formed using a low-temperature Titanium-Nickel-Gold-Tin PVD metallization. In other embodiments, the second reflective material 250 can be deposited and then heated to reflow the second reflective material 250 further into the kerfs 222. Pressure can also be applied to the microelectronic substrate, or the second reflective material 250 can be deposited in a vacuum environment and heated at a higher pressure, to force the second reflective material 250 further into the kerfs 222. The extent that the reflective sidewalls 254 cover the sidewalls 236a or 236b can be controlled by the flow and adhesion properties of the reflective material 250 and the size of the kerfs 222. In addition to its reflective properties, the second reflective material 250 can further serve as a fillet for attaching individual dies 256 to other substrates or microelectronic devices.

Figure 3H:
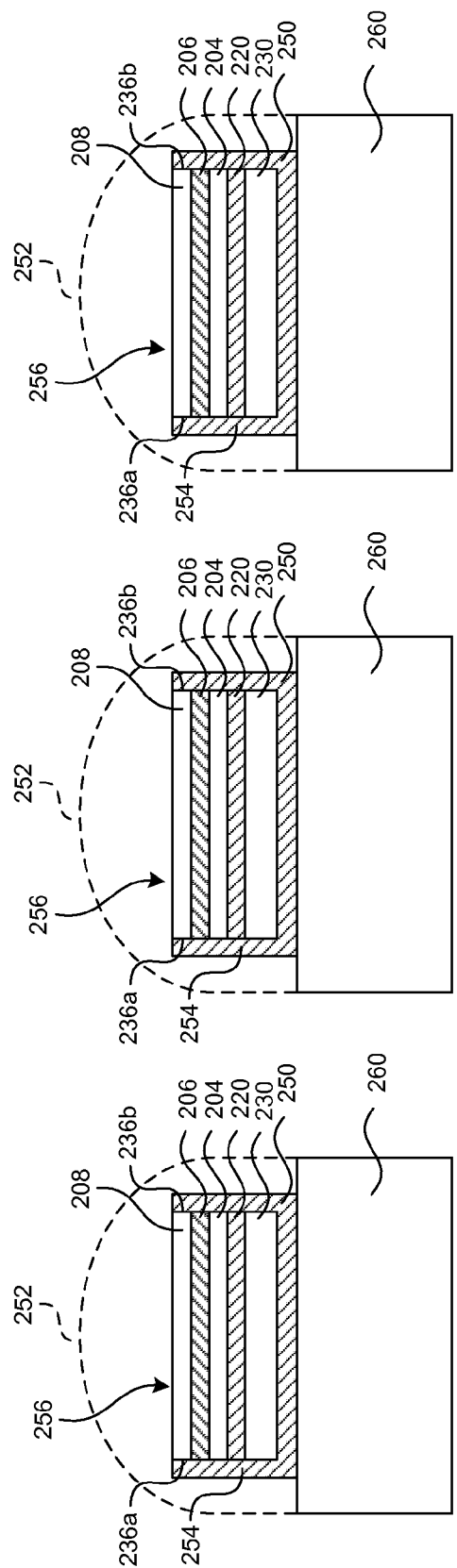

FIG. 3H is a cross-sectional view of a plurality of individual dies 256 that have been removed from the carrier substrate 240 and transferred to package substrates 260. In one embodiment, the package substrates 260 comprise a ceramic/polymer material. The package substrates 260 can be coated with a metallic film, such as a silver, gold, or copper film for improved adhesion with the individual dies 256. In some embodiments, an individual die 256 can be placed directly on the package substrate 260 using a tool that picks the individual die 256 from the carrier 240, "flips" the die orientation, and places the individual die 256 with the second reflective material 250 proximate to the package substrate 260. In other embodiments, the individual die 256 can be picked from the carrier 240, flipped, and placed on an intermediate carrier substrate (not shown). The die 256 can then be picked from the intermediate carrier substrate and placed on the package substrate 260 with the second reflective material 250 proximate to the package substrate 260. In some embodiments, the second reflective material 250 is further coated along the sidewalls 236a, 236b while the individual die 256 is being placed on the package substrate 260. For example, a heated die-attach tool can heat the second reflective material 250 to soften or reflow the second reflective material 250 while the die 256 is being placed on the package substrate 260 as described above.

In addition to providing increased lumen output, several embodiments of the technology also enable the substrate 200 to be cut into individual dies by blade dicing, which can be less expensive and less complicated than stealth dicing or laser dicing. For instance, some devices in the prior art require laser dicing to avoid chipping or delaminating the reflective material 220, but several embodiments of the present technology circumvent this threat by cutting the substrate 200 into individual dies before applying the reflective sidewalls 254.

Another expected advantage of several embodiments of the present technology is that the relatively thin support substrate 230 can enhance thermal performance. In some embodiments, the support substrate 230 can be thinned to a thickness of about 100-300 microns. The present technology enables the support substrate 230 to be so thin because individual dies remain on a carrier substrate to undergo further processing after dicing. The dies are ready to be mounted directly from the carrier substrate 240 to the SSL substrate 260 without handling by wafer bonding or debonding equipment. The dies accordingly do not require such a thick support substrate 230 for interfacing with this type of equipment. By reducing the thickness of the substrate 230, the substrate 230 can retain less heat and can accordingly improve SSL performance.

In selected embodiments, a lens 252 can be formed over the SSE 202. The lens can include a transmissive material made from silicone, polymethylmethacrylate (PMMA), resin, or other materials with suitable properties for transmitting the radiation emitted by the SSE 202. The lens 252 can be positioned on the package substrate 260 and over the SSE 202 such that light emitted by the SSE 202 and reflected off the first reflective material 220 and the reflective sidewall 254 passes through the lens 252. The lens 252 can include various diffusion features, such as a curved shape, to diffract or otherwise change the direction of light emitted by the SSE 202 as it exits the lens 252.

In selected embodiments, a converter material along and/or in the lens 252 generates a desired color of light from the SSE device 202. The converter material can include a phosphor-containing cerium (III)-doped yttrium aluminum garnet (YAG) at a particular concentration for emitting a range of colors from green to yellow to red under photoluminescence. In other embodiments, the converter material can include neodymium-doped YAG, neodymium-chromium double-doped YAG, erbium-doped YAG, ytterbium-doped YAG, neodymium-cerium double-doped YAG, holmium-chromium-thulium triple-doped YAG, thulium-doped YAG, chromium (IV)-doped YAG, dysprosium-doped YAG, samarium-doped YAG, terbium-doped YAG, and/or other suitable wavelength conversion materials. In other embodiments, the converter material can be separate from the lens 252 or can be absent altogether.

From the foregoing, it will be appreciated that specific embodiments of the technology have been described herein for purposes of illustration, but that various modifications may be made without deviating from the disclosure. For example, some of the embodiments described above discuss the reflective material as being titanium-nickel-gold-tin or titanium-nickel-silver-tin, but in other embodiments other materials or compounds having similar characteristics, properties or functions can be used. Likewise, material choices for the SSE and substrates can vary in different embodiments of the disclosure. Furthermore, while the sidewall metallization is illustrated on two sidewalls of an SSL device, in other embodiments, there can be more or fewer sidewalls coated with reflective material. Many of the elements of one embodiment may be combined with other embodiments in addition to or in lieu of the elements of the other embodiments. Accordingly, the disclosure is not limited except as by the appended claims.

We claim:

1. A solid state lighting device, comprising:
   a support substrate having a first surface, a second surface opposite the first surface, and a substrate sidewall;
   a solid state emitter mounted to the first surface of the support substrate, the solid state emitter having an emitter sidewall;
   a first reflective material extending along at least a portion of the substrate sidewall and along at least a portion of the emitter sidewall; and
   a second reflective material between the support substrate and the solid state emitter.

2. The device of claim 1 wherein the reflective material includes Gold, Silver, Silver-Tin, Gold-Tin, Titanium-Nickel-Gold-Tin or Titanium-Nickel-Silver-Tin.

3. The device of claim 1, further comprising a converter material and a lens positioned over at least a portion of the solid state emitter.

4. The device of claim 1 wherein the support substrate has a thickness from about 100 microns to about 300 microns.

5. A solid state lighting device, comprising:
   a support substrate having a sidewall;
   a solid state emitter attached to the support substrate, the solid state emitter having a first semiconductor material, a second semiconductor material, and an active region positioned between the first semiconductor material and the second semiconductor material, and the solid state emitter having a sidewall defined by edges of the first semiconductor material, the active region and the second semiconductor material;
   a reflective lateral wall positioned adjacent to the solid state emitter and the support substrate, wherein the reflective lateral wall faces the sidewall of the solid state emitter and the sidewall of the support substrate; and a reflective material positioned between the support substrate and the solid state emitter.

6. The device of claim 5, further comprising a transparent, electrically conductive material positioned between the reflective material and the solid state emitter.

7. The device of claim 5 wherein the support substrate includes a first surface and a second surface opposite the first surface, wherein the solid state emitter is attached to the first surface of the support substrate, and wherein the reflective material is a first reflective material, the device further comprising a second reflective material extending along a cross-sectional dimension across the second surface of the support substrate.

8. The device of claim 7 wherein the lateral wall and the second reflective material are contiguous.

9. The device of claim 5 wherein the support substrate has a thickness from about 100 microns to about 300 microns.

10. The device of claim 5 wherein the support substrate includes a first surface and a second surface, wherein the reflective material is a first reflective material, and wherein the solid state emitter is attached to the first surface via the first reflective material, the device further comprising:
   a second reflective material positioned on the second surface of the support substrate;
   a package substrate, wherein the second reflective material bonds the support substrate to the package substrate; and
   a lens positioned on the package substrate, wherein the lens encompasses the solid state emitter.

11. A solid state lighting device, comprising:
   a support substrate;
   a solid state emitter mounted to the support substrate, the solid state emitter having a sidewall;
   a reflective material extending along at least a portion of the sidewall and along a cross-sectional dimension across the support substrate; and
   a package substrate, wherein at least a portion of the reflective material is positioned between the support substrate and the package substrate.

12. A solid state lighting device, comprising:
   a support substrate;
   a solid state emitter mounted to the support substrate, the solid state emitter having a sidewall;
   a reflective material extending along at least a portion of the sidewall and along a cross-sectional dimension across the support substrate;
   a package substrate, wherein the support substrate is mounted to the package substrate via the reflective material; and
   a lens positioned on the package substrate and encompassing the solid state emitter.

13. The device of claim 11 wherein the sidewall is a first sidewall, wherein the solid state emitter further includes a second sidewall, wherein the reflective material extends along at least a portion of the second sidewall, and wherein the reflective material extends contiguously from the first sidewall, along the cross-sectional dimension, to the second sidewall.

14. The device of claim 11 wherein the reflective material is a first reflective material, the device further comprising a second reflective material positioned between the support substrate and the solid state emitter.

15. The device of claim 11 wherein the support substrate includes a first surface and a second surface opposite the first surface, wherein the solid state emitter is mounted to the first surface of the support substrate, and wherein the reflective material extends along the cross-sectional dimension across the second surface of the support substrate.

16. A solid state lighting device, comprising:
   a support substrate;
   a solid state emitter mounted to the support substrate, the solid state emitter having a sidewall;
   a first reflective material extending along at least a portion of the sidewall and along a cross-sectional dimension across the support substrate;
   a second reflective material positioned between the support substrate and the solid state emitter; and
   a transparent, electrically conductive material positioned between the second reflective material and the solid state emitter.

* * * * *